US009287114B2

(12) United States Patent
Haehner et al.

(10) Patent No.: US 9,287,114 B2
(45) Date of Patent: Mar. 15, 2016

(54) METHOD OF MODIFYING SURFACES

(75) Inventors: Georg Haehner, Fife (GB); Malgorzata Adamkiewicz, Fife (GB); David O'Hagan, Fife (GB)

(73) Assignee: University Court of the University of St Andrews, St Andrews (GB)

( * ) Notice: Subject to any disclaimer, the term of this patent is extended or adjusted under 35 U.S.C. 154(b) by 37 days.

(21) Appl. No.: 14/237,954

(22) PCT Filed: Aug. 15, 2012

(86) PCT No.: PCT/GB2012/000659
§ 371 (c)(1),
(2), (4) Date: Apr. 4, 2014

(87) PCT Pub. No.: WO2013/030516
PCT Pub. Date: Mar. 7, 2013

(65) Prior Publication Data
US 2014/0203414 A1    Jul. 24, 2014

(30) Foreign Application Priority Data

Aug. 26, 2011 (GB) .................................. 1114798.0

(51) Int. Cl.
| | |
|---|---|
| H01L 23/18 | (2006.01) |
| H01L 21/02 | (2006.01) |
| B82Y 30/00 | (2011.01) |
| C23C 16/30 | (2006.01) |
| C23C 16/455 | (2006.01) |
| B05D 3/10 | (2006.01) |
| H01L 23/00 | (2006.01) |

(52) U.S. Cl.
CPC .......... *H01L 21/02359* (2013.01); *B05D 3/107* (2013.01); *B82Y 30/00* (2013.01); *C23C 16/30* (2013.01); *C23C 16/45525* (2013.01); *H01L 23/564* (2013.01); *H01L 2924/0002* (2013.01)

(58) Field of Classification Search
CPC ................... H01L 21/02337; H01L 21/02307; H01L 21/02359
USPC ..................... 438/778, 781; 257/788
See application file for complete search history.

(56) References Cited

U.S. PATENT DOCUMENTS

| | | | | |
|---|---|---|---|---|
| 5,830,539 | A * | 11/1998 | Yan .......................... | A61L 27/28 427/2.13 |
| 6,316,098 | B1 * | 11/2001 | Yitzchaik et al. ............. | 428/339 |
| 6,548,121 | B1 | 4/2003 | Bauer et al. | |
| 2003/0219535 | A1 | 11/2003 | Chang et al. | |
| 2006/0029732 | A1 * | 2/2006 | Kobrin et al. ............... | 427/248.1 |
| 2006/0083772 | A1 * | 4/2006 | DeWitt et al. ................ | 424/426 |
| 2007/0012249 | A1 * | 1/2007 | Miyazawa ............ | C23C 16/452 118/723 R |
| 2007/0077779 | A1 | 4/2007 | Rantala et al. | |
| 2008/0149566 | A1 * | 6/2008 | Messersmith et al. ........ | 210/702 |
| 2009/0082222 | A1 * | 3/2009 | Cai et al. .......................... | 506/16 |
| 2009/0231673 | A1 * | 9/2009 | Oden et al. ..................... | 359/291 |
| 2011/0241260 | A1 * | 10/2011 | Hong ............... | G01N 33/54373 264/425 |
| 2014/0206251 | A1 * | 7/2014 | Stokes ................. | C09D 141/00 442/91 |

FOREIGN PATENT DOCUMENTS

| | | |
|---|---|---|
| GB | 1 529 995 A | 10/1978 |
| WO | WO 00/24527 A1 | 5/2000 |
| WO | WO 2006/020308 A3 | 2/2006 |
| WO | WO 2008/049108 A1 | 2/2006 |

OTHER PUBLICATIONS

International Search Report and Written Opinion for Application PCT/GB2012/000659 dated Jan. 4, 2013.
Search Report for Application No. GB 1114798.0 dated Jan. 19, 2012.
Ciampi, S. et al., *Functionalization of Acetylene-Terminated Monolayers on Si(100) Surfaces: A Click Chemistry Approach*, Langmuir, American Chemical Socity, vol. 23, No. 18, (Aug. 2007), pp. 9320-9329.
Im, S. G. et al., *A Directly Patternable Click-Active Polymer Film via Inititated Chemical Vapor Deposition (iCVD)*, Thin Solid Films, vol. 517, No. 12 (Apr. 2009) pp. 3606-3611.
Maoz, R. et al., "Constructive Nanolithography"; *Inert Monolayers as Patternable Templates for in-Situ Nanofabrication of metal-Semiconductor-Organic Surface Structures—A Generic Approach*, Advanced Materials, XP-000958769, vol. 12, No. 10 (May 2000) pp. 725-731.
Rohde, R. D. et al., *A Non-Oxidative Approach Toward Chemically and Electrochemically Functionalizaing Si(111)*, J. Am. Chem. Soc., vol. 128 (Jan. 2006), pp. 9518-9525.
Carbene. Retrieved Sep. 2, 2015, from <https://en.wikipedia.org/w/index.php?title=carbene&oldid=678348780 >; last modified Aug. 28, 2015.

* cited by examiner

*Primary Examiner* — George Fourson, III
(74) *Attorney, Agent, or Firm* — Alston & Bird LLP

(57) ABSTRACT

The invention provides a method for chemically modifying a surface of a substrate, preferably a silicon substrate, including the steps of providing a substrate having at least a portion of a surface thereof coated with an organic coating composition including unsaturated moieties forming a surface coating, and introducing a vapor phase reactive intermediate species based on a Group 14 or Group 15 element from the Periodic Table of Elements to the substrate whereupon the reactive intermediate species is able to react with a number of the unsaturated moieties in the coating composition thereby chemically modifying the surface coating. Also disclosed is a surface-modified substrate obtained or obtainable by the method, and uses thereof in the fabrication of MEMS and IC devices.

25 Claims, 2 Drawing Sheets

METHOD OF MODIFYING SURFACES

FIELD

The present invention relates to a method for chemically modifying a surface of a substrate, especially, but not exclusively, a silicon substrate, and to chemically modified substrates, especially, but not exclusively, silicon substrates, obtained or obtainable by said method.

BACKGROUND

Both integrated circuit (IC) device fabrication and microelectromechanical systems (MEMS) fabrication make use of one or more layers of particular coatings deposited on, and typically chemically bonded to a surface of, a substrate for various purposes.

In some instances, such as when the one or more coating layers are used as a patterned masking material (e.g. by photolithography), the one or more layers are deposited on a substrate and subsequently removed after the pattern is transferred to an underlying layer.

In other instances, the one or more coating layers are deposited to perform a function in a device or system and remain as part of the fabricated device, e.g. by etching.

The small (often nanometer) size scale of some IC devices and MEMS means they are suitable for use in a wide range of applications including inkjet printers, accelerometers, gyroscopes, pressure sensors, displays, optical switching technology, biological sciences, and the like. Such uses means that the type and properties of the one or more coating layers on the substrate surface are chosen to provide a particular functionality to the surface, typically by provision of specific functional moieties.

It is known to be desirable to provide one or more uniform, thin coating layers, such as silane coating layers, on substrate surfaces, especially silicon substrate surfaces. Those working in the IC device and MEMS fields have recognized the advantages of vapour-deposited coatings (i.e. coatings formed when a chemically reactive species present in a vapour is reacted with a surface of a substrate) over coatings applied using liquid-based immersion, spray-on and spin-on techniques, including: elimination of stiction (static friction) induced by capillary forces; control of the coating environment (particularly the amount of moisture present); provision of an extremely smooth coating surface without any detectable number of sub-micron aggregates; consistent uniform coating properties with micron- and nanometer-sized patterns such as microchannels and pores; solvent-free processing with no contamination; and faster processing which is compatible with MEMS clean room processing protocols.

Vapour deposition of coatings is particularly useful for deposition of thin coatings having a thickness ranging from around 5 Å to around 1000 Å (although may be used for increased coating thicknesses up to around 2000 Å). In particular, vapour deposition can be used for the preparation of a self-assembled monolayer (SAM) of a particular chemical species, i.e. an organised layer of amphiphilic molecules in which one end of the molecule (the "head group") becomes chemisorbed onto the surface of a substrate, whilst the other end of the molecule (the "tail group"), which may be provided with a terminal functional group, achieves two-dimensional organisation until the substrate surface is covered in a single, orderly, monolayer of molecules.

In the context of IC devices and MEMS it is known to provide a silicon substrate with a silane SAM, with the head group of the silane being hydrophilic and strongly chemisorbed to a surface of the silicon substrate, and the tail group (connected to the head group by an alkyl chain) being hydrophobic to provide desired wetting and interfacial properties. For example, with certain MEMS, a hydrophobic surface (coating) is needed to prevent adhesion of adjacent MEMS surfaces due to capillary forces in water.

Despite the many advances that have been made in the field of fabrication of IC devices and MEMS, there remains a need to protect, or further protect, the surface(s) of these entities from environmental influences, e.g. humidity, to ensure their reliable, long-term performance. There is also a desire to be able to functionalise, or further functionalise, the surface(s) of these entities in an application-specific manner, e.g. to provide a surface which is sensitive to protein absorption.

SUMMARY

The present invention seeks to address these needs and to build upon the advances made to date in this particular technical field.

According to the present invention there is provided a method for chemically modifying a surface of a substrate, preferably a silicon substrate, comprising the steps of:

providing a substrate having at least a portion of a surface thereof coated with an organic coating composition comprising unsaturated moieties forming a surface coating, and introducing a vapour phase reactive intermediate species based on a Group 14 or Group 15 element from the Periodic Table of Elements to the substrate whereupon said reactive intermediate species is able to react with a number of the unsaturated moieties in the coating composition thereby chemically modifying the surface coating.

Although the preferred substrate is described as being a silicon substrate, it is within the scope of the invention to apply the method to other suitable substrates, including (but not limited to) those made of: polymers, metals (including gold, nickel, aluminium, copper, chromium, titanium, tungsten, platinum and silver) and/or ceramics (including silicon nitride, aluminium nitride, titanium nitride and silicon carbide).

Advantageously, the vapour phase reactive intermediate species may be formed in situ in an appropriate reaction vessel from a suitable precursor material. Alternatively, the reactive intermediate species may be formed in a separate method and subsequently introduced (in a vapour phase) to the substrate.

Preferably the reactive intermediate species is a reactive species which is chosen from the group comprising: carbenes, nitrenes, silylenes, germylenes and stannylenes. Each of these species preferably takes the form RR'X: (with ":" denoting two valence electrons) where X=C, N, Si, Ge or Sn and each of R and R' may be hydrogen, a halogen, an alkyl, perfluoro-alkyl, substituted alkyl, cycloalkyl, substituted cycloalkyl, alkenyl, substituted alkenyl, cycloalkenyl, substituted cycloalkenyl, alkynyl, substituted alkynyl, cycloalkynyl, substituted cycloalkynyl, phenyl, substituted phenyl, benzyl, or substituted benzyl group. Furthermore R and R' may be different or identical groups.

Preferably the precursor material is chosen from the group consisting of: hexafluoroacetone azine, hexafluoropropene oxide, 2,2,2-trifluoroethylamine hydrochloride, ethyl diazoacetate, phenyl azide, tridecafluorononyl azide, 1,3-ditertbutyl-2,2-dichloro-1,3-diaza-2-sila-4-cyclopentene and 2,2-diphenyl-1,1,3,3-tetramethyl-1,2,3-trisilacycloheptane.

Advantageously the organic coating composition may comprise molecules having a terminal unsaturated moiety at the distal end thereof. The terminal unsaturated moiety may be an olefinic group, preferably a vinyl group or a triple bond, a carbonyl group or an imine group.

Preferably the organic coating composition is a silane composition, further preferably a trichlorosilane composition, comprising molecules of C5 to C22 carbon chain length. In a preferred embodiment of the invention, the silane composition comprises one or both of 10-undecenyltrichlorosilane and 14-pentadecenyltrichlorosilane, each having a terminal vinyl group at the distal end of the alkyl chain from the substrate to which the composition molecules are chemisorbed.

The surface coating may be a monolayer coating, preferably a SAM coating, having a thickness in the range of from around 0.5 to around 3 nm.

Preferably the vapour phase reactive intermediate species is reacted with the surface coating on the substrate at a temperature in the range of from around 50° C. to around 250° C., further preferably in the range of from around 60° C. to around 220° C., and most preferably in the range of from around 70° C. to around 200° C., possibly around 160° C. To achieve these reaction conditions, the interior of the reaction vessel may be heated, for example by placement of the reaction vessel in an oil bath, until the desired temperature is reached and subsequently maintained for the duration of the reaction.

Preferably the vapour phase reactive intermediate species is reacted with the surface coating on the substrate for a period in the range of from around 5 minutes to around 48 hours, further preferably in the range of from around 10 minutes to around 12 hours, and most preferably in the range of from around 15 minutes to around 6 hours, possibly around 20 minutes.

In one aspect, the method of the invention may further comprise the step of coating at least a portion of a surface of the substrate with the organic coating composition prior to provision of the substrate for chemical modification (rather than merely providing a pre-coated substrate for chemical modification).

The organic coating composition may preferably be provided as a vapour phase species under suitable conditions and with suitable apparatus as is well known to one skilled in the art of chemical vapour phase deposition technology.

In a further aspect, the method of the invention may further comprise the step of pre-cleaning at least a portion of a surface of the substrate prior to the aforementioned coating step. In the field of fabrication of IC devices and MEMS, the provision of extremely clean substrate surfaces is of paramount importance due the scale of the features provided thereon (e.g. microchannels) as compared to the scale of potential contaminant particles. Contaminant particles that may be present and which ought to be removed prior to any application of a coating include: dust, pollen, clothing particles, bacteria, salts, ionic species, heavy metal atoms, smog, skin oil, fluxes, lubricants, solvent vapours, etc.

The pre-cleaning step may include a single step or multiple steps, and may involve use of one or both of wet-chemical and dry techniques.

Suitable wet-chemical cleaning techniques include:
sulphuric acid/hydrogen peroxide/deionized water mixture (at 110-130° C.): usually used to remove organic contaminants;
hydrofluoric acid or diluted hydrofluoric acid (at 20-25° C.): usually used to remove oxides and metal contaminants;
ammonium hydroxide/hydrogen peroxide deionized water mixture (at 60-80° C.): usually used to remove particulate matter, and organic and metal contaminants;
hydrochloric acid/hydrogen peroxide/deionized water mixture (60-80° C.): usually used to remove metallic contaminants from, in particular, silicon substrates.

A suitable dry cleaning technique includes treatment of a substrate with ozone.

In a yet further aspect, the method of the invention may yet further comprise the step of post-cleaning the chemically modified surface coating of the substrate.

The post-cleaning step may include a single step or multiple steps, and may involve use of ultrasonic bath, filled sequentially with solvents including one or more of toluene, dichloromethane, chloroform, ethanol, water, etc. Once finally post-cleaned, the surface-modified substrate may be stored in a suitable vessel, such as a desiccator.

In accordance with the present invention, chemical modification of the surface coating may be temporary and/or reversible. If temporary, the modification may be designed to endure for a particular period of time before degrading or being completely removed. Alternatively, the modification may be designed to effectively function as a protective precursor in readiness for further chemical modification at a later date.

According to the present invention there is also provided a surface-modified substrate, preferably a silicon substrate, obtained or obtainable by the method of the invention as hereinbefore described.

Advantageously, a surface-modified substrate, especially a silicon substrate, according to the invention may be used to fabricate microelectromechanical systems (MEMS) and/or integrated circuit (IC) devices.

BRIEF DESCRIPTION OF THE DRAWINGS

For a better understanding, the present invention will now be more particularly described, by way of non-limiting example only, with reference to the accompanying figures, in which.

Figure 1:
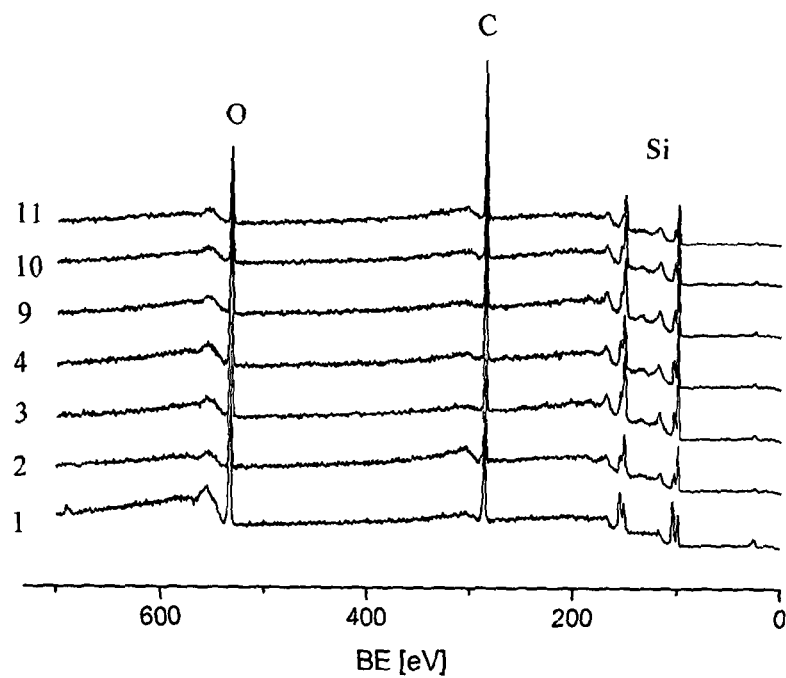
FIG. 1 is an X-ray photoelectron spectroscopy (XPS) spectrum showing the results obtained from the comparative samples described below; and each of FIGS. 2, 3 and 4 are XPS spectra showing the results obtained from certain of the samples according to the invention described below.

In all cases, the results are illustrative of the binding energy (BE) of the K-shell electrons of the particular elements observed.

DETAILED DESCRIPTION

The following describes a method for chemically modifying a surface of a silicon substrate in accordance with the invention, including the sequential steps of:
pre-cleaning at least a portion of a surface of the silicon substrate;
coating said cleaned portion of the surface of the silicon substrate with an organic coating composition;
provision of the coated substrate for chemical modification; and
introduction of a vapour phase reactive intermediate species to the coated substrate for chemical modification.

Chemicals

Commercially available n-type, one-side polished silicon wafers of (100) orientation and approximately 500 μm thickness (available from Wacker Chemie AG, Munich, Germany) were used as substrates to be chemically modified. Each of the following methyl-terminated species were obtained from Alfa Aesar—a Johnson Matthey Company (Lancashire, United Kingdom): octadecyltrichlorosilane ($CH_3(CH_2)_{17}SiCl_3$—95%), dodecyltrichlorosilane ($CH_3(CH_2)_{11}SiCl_3$—95%) and decyltrichlorosilane ($CH_3(CH_2)_9SiCl_3$—97%). HPLC-grade toluene (99.9%) was obtained from Sigma-Aldrich Company Limited (Dorset, United Kingdom). HPLC-grade dichloromethane was obtained from VWR International Limited (Leicestershire, United Kingdom). Hydrogen peroxide (30%), ammonium hydroxide (35%), sulphuric acid (95%), and hydrochloric acid (36%) were all obtained from Fisher Scientific UK Limited (Leicestershire, United Kingdom). All chemicals were used without further purification.

General Experimental Conditions

All steps were performed in a fume hood under an inert atmosphere of nitrogen or argon using oven-dried glassware and a double vacuum manifold with the inert gas passing through a bed of activated 4 Å molecular sieves, potassium hydroxide and self-indicating silica gel.

Pre-Cleaning of the Silicon Substrates

All pre-cleaning treatments of the silicon substrates were carried out in a standard chemical laboratory (without clean room conditions). First, silicon wafers were cut into 1.5×1.5 $cm^2$ pieces and then extensively cleaned in four successive steps:

(1) exposure to an ozone atmosphere for 30 minutes which cleaned the wafers by transforming organic compounds (such as hydrocarbons and oils) on the surfaces of the wafers into gases or water-soluble species;

(2) washing in a 2:1 solution of concentrated sulphuric acid and 30% hydrogen peroxide respectively at 70° C. for 15 minutes which removed organic contaminants from the surfaces of the wafers by oxidative breakdown;

(3) washing in a 1:5:1 solution of concentrated ammonium hydroxide, deionized water and 30% hydrogen peroxide at 70° C. for 15 minutes which removed inorganic contaminants (including heavy metal complexes of Group IB and IIB metals and other metals such as gold, silver, copper, nickel, zinc and chromium) as well as unwanted particulate matter (such as dust particles, silica and silicon) and any remaining organic contaminants;

(4) washing in a 1:6:1 solution of concentrated hydrochloric acid, deionized water and 30% hydrogen peroxide at 70° C. for 15 minutes which formed a pure native oxide layer and removed alkaline ions that would otherwise be capable of forming ammonium hydroxides (insoluble hydroxides) in basic solutions.

After each step the wafers were thoroughly rinsed with deionized water and dried under pure nitrogen gas.

Once pre-cleaned, the substrates were immediately coated with an organic (silane) coating composition, as will now be described.

Provision of Silane Coating

The vinyl-terminated trichlorosilanes 10-undecenyltrichlorosilane ($CH_2=CH(CH_2)_9SiCl_3$) (1) and 14-pentadecenyltrichlorosilane ($CH_2=CH(CH_2)_{13}SiCl_3$) (2) were synthesized according to the synthetic route shown below to be used as coating species for the pre-cleaned silicon substrates:

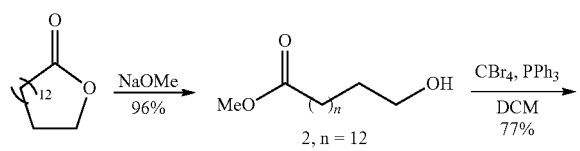

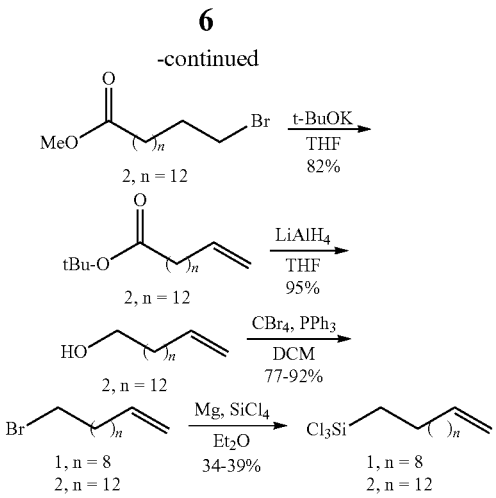

(i) Preparation of methyl 15-hydroxypentadecanoate

Sodium methoxide was generated by the addition of sodium metal (2.4 g, 104.3 mmol, 5.0 eq) to methanol (130 mL) at 0° C. with stirring. The mixture was warmed to room temperature and stirred until all of the sodium was consumed. ω-Pentadecalactone (5.0 g, 20.8 mmol, 1.0 eq) was added in a single portion, and the solution was stirred at 80° C. for 3 hours. The reaction was quenched with hydrochloric acid (1 M, 175 mL) and diluted with water (175 mL). The aqueous layer was extracted with ether (3×100 mL), and the combined organic layers were washed with water (150 mL), brine (150 mL), and dried over magnesium sulphate. The product was purified by silica gel chromatography (2:1 hexane:ethyl acetate), yielding methyl 15-hydroxypentadecanoate (4.24 g, 85%) as a colourless solid.

(ii) Preparation of methyl 15-bromopentadecanoate from methyl 15-hydroxypentadecanoate To a solution of methyl 15-hydroxypentadecanoate (4.2 g, 15.6 mmol, 1.0 eq) and carbon tetrabromide (5.7 g, 17.1 mmol, 1.1 eq) in dichloromethane (15 mL) cooled to 0° C., was added triphenyl phosphine (4.3 g, 17.1 mmol, 1.1 eq) in portions over 30 min with vigorous stirring. Upon addition of the phosphine, the colourless solution turned a pale brown colour and was stirred for an additional 2 hours at room temperature. The mixture was concentrated in vacuo (using a rotary evaporator attached to a diaphragm pump) to a brown oil. Hexane (200 mL) was quickly added and the resulting mixture was stirred for 15 minutes. The resultant white precipitate was removed by filtration, and the filtrate was concentrated in vacuo. The product was purified by silica gel chromatography (20:1 hexane:ethyl acetate), yielding methyl 15-bromopentadecanoate (4.6 g, 90%) as a colourless solid.

(iii) Preparation of tertiary-butyl 14-pentadecanoate from methyl 15-bromopentadecanoate Methyl 15-bromopentadecanoate (4.0 g, 11.9 mmol, 1.0 eq) was added to a solution of potassium tertiary butoxide in tetrahydrofuran (1 M, 60 mL). The reaction mixture was stirred at room temperature for 1 hour, then was quenched with hydrochloric acid (1 M, 150 mL). The aqueous layer was extracted with ether (3×100 mL), and the combined organic layers were washed with water (150 mL), brine (150 mL) and dried over magnesium sulphate. The product was purified by silica gel chromatography (100:1 hexane:ethyl acetate), yielding tertiary-butyl 14-pentadecanoate (1.5 g, 43%) as a colourless oil.

(iv) Preparation of pentadec-14-en-1-ol from tertiary-butyl 14-pentadecanoate

To a solution of lithium aluminium hydride (0.5 g, 12 mmol, 1.5 eq) in tetrahydrofuran (15 mL) cooled to 10° C., was added tertiary-butyl 14-pentadecanoate (2.4 g, 8 mmol, 1.0 eq) via cannula in portions over a 30 minute period. After the addition was complete the reaction mixture was warmed to room temperature and then refluxed for 16 hours. The reaction mixture was then cooled again to 10° C. and diluted with diethyl ether (15 mL). The reaction was quenched over 30 minutes by dropwise addition of water (0.5 mL), aqueous sodium hydroxide (15%, 0.5 mL), and water (1.2 mL). The solution was stirred for 30 minutes and the resultant white precipitate was removed by filtration. The residue was washed with diethyl ether (3×10 mL) and the organic filtrates were combined, dried over anhydrous sodium sulfate, and concentrated under reduced pressure. The product was purified by silica gel chromatography (3:1 hexane:ethyl acetate), yielding pentadec-14-en-1-ol (1.7 g, 94%) as a colourless oil.

(v) Preparation of (A) 11-bromo-1-undecene and (B) 14-bromo-1-pentadecene (A) To a solution of undec-10-en-1-ol (5.0 g, 29.4 mmol, 1 eq) and carbon tetrabromide (10.7 g, 35.2 mmol, 1.1 eq) in dichloromethane (30 mL) cooled to 0° C., was added triphenyl phosphine (8.5 g, 32.3 mmol, 1.1 eq) in portions over 30 minutes with vigorous stirring. Upon addition of the phosphine, the colourless solution turned a pale brown colour and was stirred for an additional 2 hours at room temperature. The mixture was concentrated in vacuo to a brown oil, hexane (300 mL) was quickly added and the resulting mixture was stirred for 15 minutes. The resultant colourless precipitate was removed by filtration, and the filtrate was concentrated in vacuo. Distillation yielded 11-bromo-1-undecene (5.2 g, 77%) as a colourless oil.

(B) To a solution of pentadec-14-en-1-ol (1.5 g, 6.5 mmol, 1 eq) and carbon tetrabromide (2.4 g, 7.2 mmol, 1.1 eq) in dichloromethane (15 mL) cooled to 0° C., was added triphenyl phosphine (1.9 g, 7.2 mmol, 1.1 eq) in portions over 30 minutes with vigorous stirring. Upon addition of the phosphine, the colourless solution turned a pale brown colour and was stirred for an additional 2 hours at room temperature. The mixture was concentrated in vacuo to a brown oil, hexane (150 mL) was quickly added and the resulting mixture was stirred for 15 minutes. The resultant colourless precipitate was removed by filtration, and the filtrate was concentrated in vacuo. This oil was purified by silica gel chromatography (hexane), yielding 14-bromo-1-pentadecene (1.1 g, 60%) as a colourless oil.

(vi) Preparation of 10-Undecenyltrichlorosilane (1) and 14-Pentadecenyltrichlorosilane (2) from (A) 11-bromo-1-undecene and (B) 14-bromo-1-pentadecene respectively (A) Dry magnesium (2.4 g, 96.9 mmol, 4.5 eq) was suspended in diethyl ether (10 mL) and tetrachlorosilane (16.0 g, 11.1 mL, 4.4 eq) was added via cannula. A solution of 11-bromo-1-undecene (5.0 g, 21.5 mmol, 1.0 eq) in diethyl ether (7 mL) was then introduced via cannula in small portions with stirring over 3 hours, and then stirred for further 16 hours at room temperature. The crude product was extracted from the resulting solids with hexane (4×70 mL). After filtration, the hexane was evaporated and distillation of the residues yielded 10-undecenyltrichlorosilane (1) (2.8 g, 34%) as a colourless oil.

(B) Dry magnesium (0.9 g, 35.9 mmol, 4.5 eq) was suspended in diethyl ether (10 mL) and tetrachlorosilane (6.0 g, 4.1 mL, 4.4 eq) was added via cannula. A solution of 14-bromo-1-pentadecene (2.3 g, 8.0 mmol, 1.0 eq) in diethyl ether (5 mL) was then introduced via cannula in small portions with stirring over 3 hours, and then stirred for further 16 hours at room temperature. The crude product was extracted from the resulting solids with hexane (4×70 mL). After filtration, the hexane was evaporated and distillation of the residues gave 14-pentadecenyltrichlorosilane (2) (1.06 g, 39%) as a colourless oil.

In addition, for comparative purposes, each of the following three methyl-terminated trichlorosilanes were obtained: decyltrichlorosilane (3), dodecyltrichlorosilane (4) and octadecyltrichlorosilane (5). The chemical structures of each of species (1) to (5) are shown below:

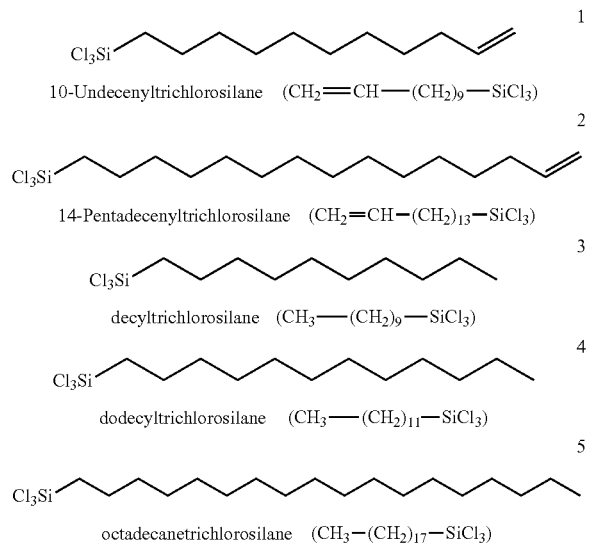

Formation of SAMs on Cleaned Silicon Substrates

Cleaned silicon wafers were transferred to sealed SCHOTT DURAN™ bottles containing either a) 0.05 mL (bottles A) or b) 0.15 mL (bottles B) of a liquid trichlorosilane precursor molecule in a separate open vessel. There was no direct contact between the liquid and the wafers during the reactive formation of SAMs on the wafer surfaces. For bottles A, air from within each was evacuated using a vacuum pump (~4 mbar) for a few seconds to allow reactive formation of the SAMs, whilst for bottles B, SAM reactive formation was carried out under atmospheric pressure. Each reaction was performed at 60° C. for 4 days to obtain SAMs of the shorter molecules (1, 3, 4), and at 70° C. for 3 days to obtain SAMs of the longer molecules (2, 5). After adsorption of the SAMs on the wafer surfaces, the wafers were withdrawn from their respective bottles, rinsed with toluene, dichloromethane and deionized water, and transferred into a desiccator. In order to remove any larger polymerized aggregates that may have been physically adsorbed onto the surfaces of the wafers, the samples were subsequently sonicated in an ultrasonic bath in each of toluene, dichloromethane and deionized water for 15 minutes.

Chemical Modification of Alkyl- and Alkenyltrichlorosilane SAM-Coated Silicon Substrates with a Reactive Intermediate Species An individual, freshly prepared, SAM-coated silicon substrate was placed in a SCHOTT DURAN™ bottle (100 mL capacity) equipped with a PTFE sealed cap. The bottle was purged three times with nitrogen, before an amount of the reactive intermediate precursor material hexafluoroacetone azine (HFAA) (boiling point: 67-68° C.) was added to the bottle in a separate, smaller, open-topped vessel.

The bottle was placed in an oil bath pre-heated to a particular fixed temperature (80° C., 120° C., 160° C.) and kept at that temperature for a particular period of time (10 minutes, 20 minutes, 30 minutes, 1 hour, 2 hours, 5 hours, 48 hours) to allow the chemical modification reaction to occur. With liquid hexafluoroacetone azine as the precursor material, the carbene $(F_3C)_2C$: is believed to be the reactive intermediate species involved in the reaction. After the reaction, each of the samples was subsequently sonicated in an ultrasonic bath in each of toluene, dichloromethane and deionized water for 15 minutes respectively. Each was then stored in a desiccator in readiness for characterization.

It should be noted that during the reaction, there was no direct contact between the liquid hexafluoroacetone azine and any of the silicon substrates—heat from the oil bath caused the liquid hexafluoroacetone azine to vaporize to form $(F_3C)_2C$: and subsequently contact the SAM-coated silicon substrates.

Surface Analytical Characterization

Each of the chemically-modified silicon substrates was analyzed using each of the following techniques:

contact angle measurement to determine their hydrophilicity/hydrophobicity;

ellipsometry to determine the thickness of the modified coating;

photoelectron spectroscopy, in particular XPS to determine the chemical composition of the modified coating; and atomic force microscopy (AFM) to investigate the homogeneity of the modified coating.

The results of these techniques are presented below.

Results

TABLE I

Methyl-Terminated SAM-coated Silicon Substrates (Comparative)

| Comp. Sample No. | HFAA (μL) | Temp. (° C.) | Time (h/m) | Coating Species | Coating Thickness (nm) Before | Coating Thickness (nm) After | Coating Contact Angle (°) Before | Coating Contact Angle (°) After | XPS (F) Signal Detected? |
|---|---|---|---|---|---|---|---|---|---|
| 1 | 50 | 160 | 5 h | (5) | 2.64 | 2.57 | 109 | 104 | No |
| 2 | 50 | 160 | 2 h | (5) | 2.63 | 2.58 | 109 | 109 | No |
| 3 | 50 | 160 | 20 m | (3) | 1.44 | 0.97 | 105 | 103 | No |
| 4 | 100 | 160 | 20 m | (3) | 1.49 | 1.14 | 105 | 103 | No |
| 5 | 50 | 120 | 20 m | (3) | — | — | 105 | 105 | — |
| 6 | 100 | 120 | 20 m | (3) | — | — | 105 | 105 | — |
| 7 | 50 | 80 | 20 m | (3) | — | — | 105 | 105 | — |
| 8 | 100 | 80 | 20 m | (3) | — | — | 105 | 105 | — |
| 9 | 200 | 160 | 20 m | (3) | 1.29 | 1.29 | 105 | 105 | No |
| 10 | 200 | 160 | 20 m | (4) | 1.55 | 1.45 | 106 | 106 | No |
| 11 | 200 | 160 | 20 m | (5) | 2.67 | 2.59 | 109 | 109 | No |

TABLE II

Vinyl-Terminated SAM-coated Silicon Substrates

| Sample No. | HFAA (μL) | Temp. (° C.) | Time (h/m) | Coating Species | Coating Thickness (nm) Before | Coating Thickness (nm) After | Coating Contact Angle (°) Before | Coating Contact Angle (°) After | XPS (F) Signal Detected? |
|---|---|---|---|---|---|---|---|---|---|
| 1 | 150 | 160 | 48 h | (1) | 1.34-1.52 | ~0.45 | 101 | 55 | Yes |
| 2 | 50 | 160 | 5 h | (1) | 1.34-1.52 | ~0.56 | 101 | 83 | Yes |
| 3 | 50 | 160 | 2 h | (1) | 1.34-1.52 | ~0.69 | 101 | 97 | Yes |
| 4 | 50 | 160 | 1 h | (1) | 1.34-1.52 | 0.86 | 101 | 95 | Yes |
| 5 | 50 | 160 | 30 m | (1) | 1.34-1.52 | 0.92 | 101 | 99 | Yes |
| 6 | 50 | 160 | 20 m | (1) | 1.34-1.52 | 1.52 | 101 | 106 | Yes |
| 7 | 50 | 160 | 10 m | (1) | 1.34-1.52 | 1.28 | 101 | 106 | Yes |
| 8 | 50 | 160 | 20 m | (1) | 1.34-1.52 | 1.27 | 101 | 106 | Yes |
| 9 | 100 | 160 | 20 m | (1) | 1.34-1.52 | 1.64 | 101 | 106 | Yes |
| 10 | 50 | 120 | 20 m | (1) | 1.34-1.52 | 1.2 | 101 | 101 | No |
| 11 | 100 | 120 | 20 m | (1) | 1.34-1.52 | 1.51 | 101 | 101 | Yes |
| 12 | 50 | 80 | 20 m | (1) | 1.34-1.52 | 1.15 | 101 | 101 | No |
| 13 | 100 | 80 | 20 m | (1) | 1.34-1.52 | 1.45 | 101 | 101 | Yes |
| 14 | 50 | 160 | 20 m | (1) | 1.52 | 1.56 | 101 | 106 | Yes |
| 15 | 100 | 160 | 20 m | (1) | 1.34 | 1.65 | 101 | 106 | Yes |
| 16 | 150 | 160 | 20 m | (1) | 1.45 | 1.47 | 101 | 106 | Yes |
| 17 | 200 | 160 | 20 m | (1) | 1.52 | 1.54 | 101 | 106 | Yes |

TABLE II-continued

Vinyl-Terminated SAM-coated Silicon Substrates

| Sample No. | HFAA (µL) | Temp. (° C.) | Time (h/m) | Coating Species | Coating Thickness (nm) Before | After | Coating Contact Angle (°) Before | After | XPS (F) Signal Detected? |
|---|---|---|---|---|---|---|---|---|---|
| 18 | 200 | 160 | 20 m | (2) | 1.91 | 2.1 | 101 | 106 | Yes |
| 19 | 300 | 160 | 20 m | (2) | 2.04 | 2.55 | 101 | 106 | Yes |
| 20 | 400 | 160 | 20 m | (2) | 2.19 | 2.28 | 101 | 105 | Yes |

Clearly, none of the comparative samples described in Table I underwent reaction with the $(F_3C)_2C$: carbene reactive species as, by reference to FIG. 1, it is clear from the XPS spectrum that no signal was observed that would correspond to the presence of fluorine atoms in the surface coating composition. This lack of reaction is confirmed by both the coating thickness measurements (before and after presentation of the coated substrate for reaction) and the coating contact angle measurements (again before and after presentation of the coated substrates for reactions), both of which remain approximately constant.

Figure 2:
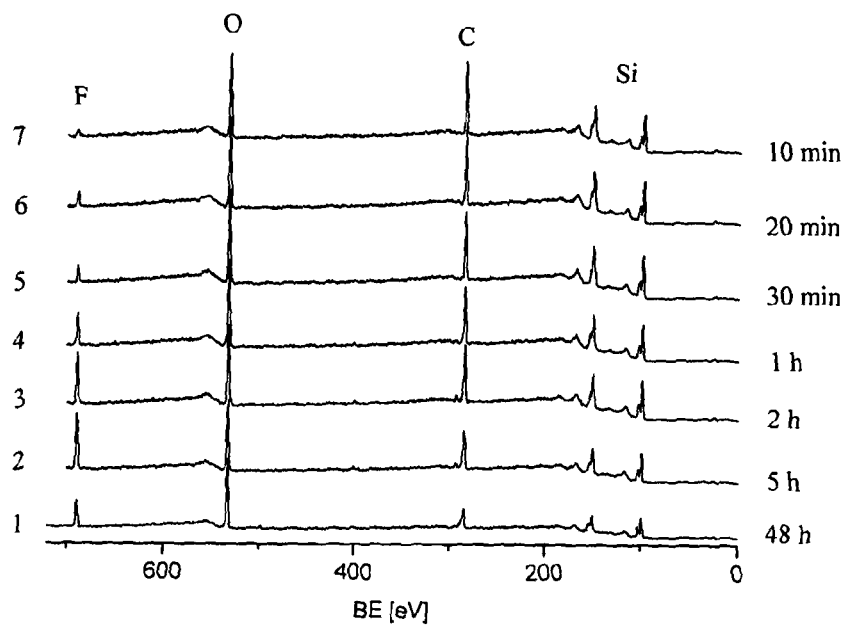

Turning to the results shown in Table II, XPS spectra for samples 1 to 7 are shown in FIG. 2. At a constant oil-bath temperature of 180° C. for substrates coated with coating species (1), it is clear that over the range of reaction times experimented with, in each case a definite signal was observed corresponding to the presence of fluorine atoms in the surface coating composition, indicating reaction of the terminal vinyl group with the $(F_3C)_2C$: carbene reactive species to provide a chemically modified surface.

Samples 2, 3 and 4 (reacted for 5 hours, 2 hours and 1 hour respectively) appeared to show the strongest signal, indicating the greatest extent of reaction between the terminal vinyl groups of the coating and the carbene species, however over these time periods (and also at 30 minutes), degradation of the SAMs coating layer was also observed (as shown by the reduced coating thickness and coating contact angle measurements). It was therefore decided to drop the reaction time to the next lowest (i.e. 20 minutes) for further experimentation.

Figure 3:
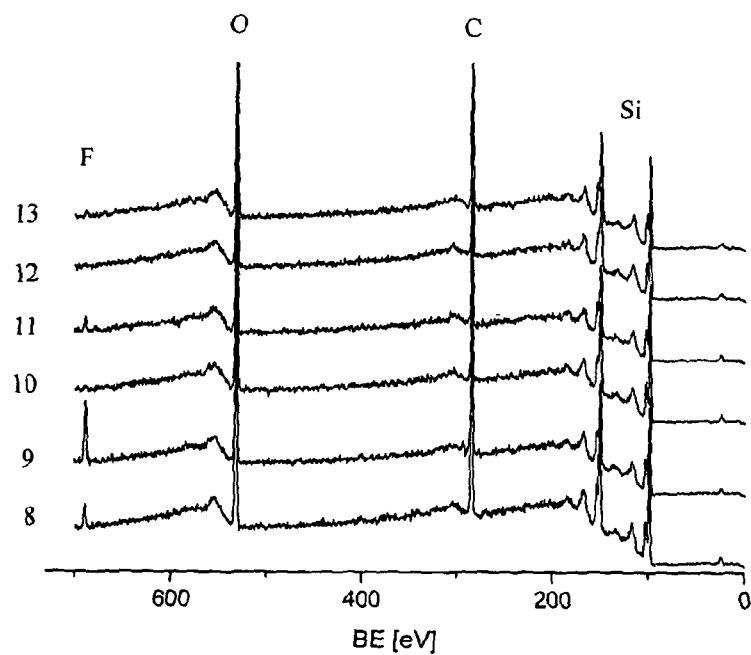

Turning back to the results shown in Table II, XPS spectra for samples 8 to 13 are shown in FIG. 3. At a constant reaction temperature of 20 minutes for substrates coated with coating species (1), it is clear that over the range of temperatures experimented with, for most combinations (with the exception of samples 10 and 12) a definite signal was observed corresponding to the presence of fluorine atoms in the surface coating composition, indicating reaction of the terminal vinyl group with the $(F_3C)_2C$: carbene reactive species to provide a chemically modified surface.

However, samples 8 and 9 (both reacted at 160° C.) appeared to show the strongest signal, indicating the greatest extent of reaction between the terminal vinyl groups of the coating and the carbene species.

Figure 4:
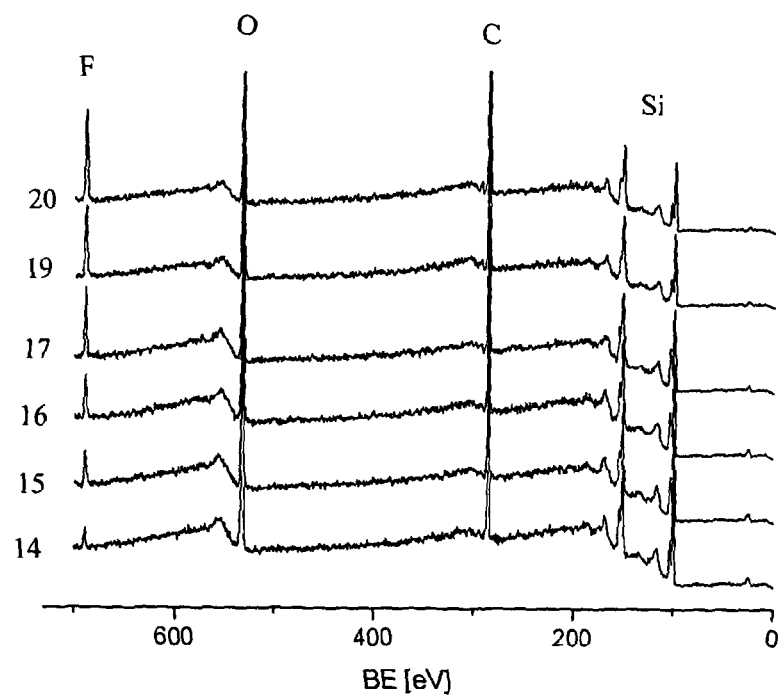

Turning again to the results shown in Table II, XPS spectra for samples 14 to 20 are shown in FIG. 4. At a constant reaction time of 20 minutes and a constant oil-bath temperature of 160° C. for substrates coated with coating species (1), the amount of hexafluoroacetone azine precursor material was varied (50 µL, 100 µL, 150 µL, 200 µL, 300 µL, 400 µL) to investigate the extent of reaction. It is clear from FIG. 4, and not altogether unsurprising, that the greatest amount of hexafluoroacetone azine precursor material (300 µL—sample 19) led to the greatest extent of reaction, with the strongest signal being observed.

From the experiments performed to date, we have therefore concluded that a reaction time of 20 minutes and an oil bath temperature of 160° C. appear to be optimum to facilitate the greatest extent of reaction between the silane SAM coating on a silicon substrate and a carbene reactive intermediate species without also causing the silane SAM to degrade. Furthermore, it appears that the more reactive intermediate precursor material is present, the better the extent of reaction.

The invention claimed is:

1. A method for chemically modifying a surface of a substrate comprising the steps of:
   providing a substrate having at least a portion of a surface thereof coated with an organic coating composition comprising unsaturated moieties forming a surface coating, and
   introducing a vapour phase reactive intermediate species selected from the group consisting of carbenes, nitrenes, silylenes, germylenes and stannylenes to the substrate whereupon said reactive intermediate species reacts with a number of the unsaturated moieties in the coating composition thereby chemically modifying the surface coating.

2. A method according to claim 1 wherein the substrate is a silicon substrate.

3. A method according to claim 1 wherein the reactive intermediate species is formed in situ from a precursor material.

4. A method according to claim 3 wherein the precursor material is selected from the group consisting of: hexafluoroacetone azine, hexafluoropropene oxide, 2,2,2-trifluoroethylamine hydrochloride, ethyl diazoacetate, phenyl azide, tridecafluorononyl azide, 1,3-ditertbutyl-2,2-dichloro-1,3-diaza-2-sila-4-cyclopentene, and 2,2-diphenyl-1,1,3,3-tetramethyl-1,2,3-trisilacycloheptane.

5. A method according to claim 1 wherein the organic coating composition comprises molecules having a terminal unsaturated moiety at the distal end thereof.

6. A method according to claim 5 wherein the terminal unsaturated moiety is a vinyl group, a triple bond, a carbonyl group, or an imine group.

7. A method according to claim 5 wherein the organic coating composition is a silane composition.

8. A method according to claim 7 wherein the silane composition comprises molecules of C5 to C22 carbon chain length.

9. A method according to claim 8 wherein the silane composition comprises one or both of 10-undecenyltrichlorosilane and 14-pentadecenyltrichlorosilane.

10. A method according to claim 1 wherein the surface coating is a monolayer coating.

11. A method according to claim 1 wherein the vapour phase reactive intermediate species is reacted with the surface coating on the silicon substrate at a temperature in the range of from around 50° C. to around 250° C.

12. A method according to claim 1 wherein the vapour phase reactive intermediate species is reacted with the surface coating on the silicon substrate for a period in the range of from around 5 minutes to around 48 hours.

13. A method according to claim 1 further comprising the step of coating at least a portion of a surface of the silicon substrate with the organic coating composition prior to the step of providing the substrate for chemical modification.

14. A method according to claim 13 wherein the organic coating composition is provided as a vapour phase species.

15. A method according to claim 13 further comprising the step of pre-cleaning at least a portion of a surface of the silicon substrate prior to the coating step.

16. A method according to claim 1 further comprising the step of post-cleaning the chemically modified surface coating of the silicon substrate.

17. A method according to claim 1 wherein chemical modification of the surface coating is temporary.

18. A method according to claim 1 wherein chemical modification of the surface coating is reversible.

19. A surface-modified substrate obtained by the method of claim 1.

20. A surface-modified substrate as claimed in claim 19 wherein the substrate is a silicon substrate.

21. A method according to claim 1 which comprises utilizing the chemically modified surface in the fabrication of microelectromechanical systems (MEMS).

22. A method according to claim 1 which comprises utilizing the chemically modified surface in the fabrication of integrated circuit (IC) devices.

23. A method according to claim 1 wherein the surface coating is a self-assembled monolayer (SAM) coating.

24. A method according to claim 1 wherein the reactive intermediate species is carbene $(F_3C)_2C$.

25. A method according to claim 24 wherein the organic coating composition comprises molecules having a terminal unsaturated moiety at the distal end thereof.

* * * * *

UNITED STATES PATENT AND TRADEMARK OFFICE
CERTIFICATE OF CORRECTION

PATENT NO.          : 9,287,114 B2
APPLICATION NO.     : 14/237954
DATED               : March 15, 2016
INVENTOR(S)         : Haehner et al.

Page 1 of 1

It is certified that error appears in the above-identified patent and that said Letters Patent is hereby corrected as shown below:

In the claims:

Column 14,
Line 14, "$(F_3C)_2C$" should read --$(F_3C)_2C$:--.

Signed and Sealed this
Second Day of August, 2016

Michelle K. Lee
*Director of the United States Patent and Trademark Office*